(12) United States Patent
Tilton et al.

(10) Patent No.: US 7,078,803 B2
(45) Date of Patent: Jul. 18, 2006

(54) INTEGRATED CIRCUIT HEAT DISSIPATION SYSTEM

(75) Inventors: Charles L. Tilton, Colton, WA (US); Donald E. Tilton, Colton, WA (US); Jeffrey K. Weiler, Liberty Lake, WA (US)

(73) Assignee: Isothermal Systems Research, Inc., Liberty Lake, WA (US)

( * ) Notice: Subject to any disclaimer, the term of this patent is extended or adjusted under 35 U.S.C. 154(b) by 0 days.

(21) Appl. No.: 10/292,073

(22) Filed: Nov. 12, 2002

(65) Prior Publication Data

US 2004/0061218 A1    Apr. 1, 2004

Related U.S. Application Data

(63) Continuation-in-part of application No. 10/260,713, filed on Sep. 27, 2002.

(51) Int. Cl.
*H05K 7/20* (2006.01)
*H01L 23/473* (2006.01)
*H01L 23/34* (2006.01)

(52) U.S. Cl. .............................. 257/714; 257/E23.098; 257/713; 257/721; 257/722; 257/716; 257/719; 257/675; 361/704; 361/699; 361/690; 361/698; 361/717; 165/80.4; 174/15.1; 174/16.3

(58) Field of Classification Search ................ 257/712, 257/713, 714, 710, 701, 702, 706, 717, 720, 257/675, 676, 716, 721, 722, E23.098; 361/704, 361/699, 690, 698, 717; 165/80.4; 174/15.1, 174/16.3

See application file for complete search history.

(56) References Cited

U.S. PATENT DOCUMENTS

| 5,220,804 | A |   | 6/1993  | Tilton et al. .................... 62/64 |
|-----------|---|---|---------|------------------------------------------|
| 5,268,814 | A | * | 12/1993 | Yakubowski ................. 361/704      |
| 5,285,351 | A | * | 2/1994  | Ikeda .......................... 361/699   |
| 5,291,064 | A | * | 3/1994  | Kurokawa ................... 257/714       |
| 5,345,107 | A | * | 9/1994  | Daikoku et al. ............. 257/717       |
| 5,528,456 | A | * | 6/1996  | Takahashi .................... 361/704     |
| 5,687,577 | A |   | 11/1997 | Ballard et al. ................. 62/64      |
| 5,705,850 | A | * | 1/1998  | Ashiwake et al. .......................... 257/714 |
| 5,731,542 | A |   | 3/1998  | Limper-Brenner et al. 174/52.4 |

(Continued)

OTHER PUBLICATIONS

Spray Cooling, Tilton, Donald E., PhD Dissertation, University of Kentucky, 1989.

(Continued)

*Primary Examiner*—Alexander Oscar Williams
(74) *Attorney, Agent, or Firm*—Michael S. Neustel

(57) ABSTRACT

An integrated circuit heat dissipation system for reducing the number of junctions in packaged integrated circuits thereby decreasing thermal impedance and increasing thermal dissipation efficiency. The integrated circuit heat dissipation system includes a lid attached to a substrate, a cap attached about the lid creating a heat dissipation chamber, and a semiconductor chip attached to the lid by a thermally conductive adhesive. The lid may or may not form a cavity about the semiconductor chip depending upon the substrate utilized. The lid preferably includes a plurality of fins extending from thereof defining a plurality of channels or a plurality of grooves thereby increasing the heat flux of the lid.

8 Claims, 18 Drawing Sheets

U.S. PATENT DOCUMENTS

| | | | | |
|---|---|---|---|---|
| 5,768,103 | A | | 6/1998 | Kobrinetz et al. .......... 361/699 |
| 5,846,852 | A | | 12/1998 | Limper-Brenner et al. .......................... 438/118 |
| 5,859,763 | A | * | 1/1999 | Nam et al. .................. 361/699 |
| 5,880,524 | A | * | 3/1999 | Xie ............................ 257/704 |
| 5,990,418 | A | * | 11/1999 | Bivona et al. ............. 174/52.4 |
| 6,317,326 | B1 | * | 11/2001 | Vogel et al. ................ 361/704 |
| 6,377,453 | B1 | * | 4/2002 | Belady ....................... 361/687 |
| 2001/0040006 | A1 | * | 11/2001 | Pompeo et al. ......... 156/307.1 |
| 2002/0113142 | A1 | * | 8/2002 | Patel et al. ................ 239/128 |

OTHER PUBLICATIONS

Spray Cooling for the 3-D Cube Computer, Tilton, Donald E. et al., InterSociety Conference on Thermal Phenomena pp. 169-176, 1994.

Liquid Nitrogen Spray Cooling of a Simulated Electronic Chip, Tilton, Donald E. et al., Proceedings of the 1993 Cryogenic Engineering Conference, Albuquerque, New Mexico, 1993.

Advanced System Packaging for Embedded High Performance Computing, Sienski, Ken, et al.

* cited by examiner

INTEGRATED CIRCUIT HEAT DISSIPATION SYSTEM

CROSS REFERENCE TO RELATED APPLICATIONS

I hereby claim benefit under Title 35, United States Code, Section 120 of U.S. patent application Ser. No. 10/260,713 filed Sep. 27, 2002 with Charles L. Tilton and Donald E. Tilton as the named inventors. This application is a continuation-in-part of the Ser. No. 10/260,713 application. The Ser. No. 10/260,713 application is currently pending. The Ser. No. 10/260,713 application is hereby incorporated by reference into this application.

BACKGROUND OF THE INVENTION

1. Field of the Invention

The present invention relates generally to semiconductor heat dissipation systems and more specifically it relates to an integrated circuit heat dissipation system for reducing the number of junctions in packaged integrated circuits thereby decreasing thermal impedance and increasing thermal dissipation efficiency.

2. Description of the Related Art

Integrated circuitry fabricated on semiconductor chips generates heat during normal operation. If the heat generated becomes excessive or the heat generated is not effectively removed, the integrated circuit device can malfunction or fail. In other words, the reliability of the integrated circuit device may be compromised if the integrated circuit device overheats. There are many ways to remove heat from an integrated circuit device, for example, by placing the integrated circuit device in a cool spot in the enclosure or using a liquid-cooled plate connected to a refrigerated water chiller. In general, the amount of heat generated by the integrated circuit device, the integrated circuit device package configuration and the expected lifetime of the product combine with many other factors determine the optimum heat removal scheme.

The interface between the integrated circuit device and the heat dissipation device used to cool the integrated circuit device may be a factor in designing a thermal solution. More specifically, microscopic air gaps (e.g., caused by surface non-uniformity) between an integrated circuit device package and a heat sink attached to the integrated circuit device package's surface may affect or degrade thermal performance. Typically, the degradation in thermal performance increases as the operating temperature increases. The surface variability induced by varying surface roughness may be reduced by using interface materials appropriate to the package type. However, it is difficult, if not impossible, to completely eliminate the surface variability.

The development of faster and denser circuit technologies and smaller packages which are accompanied by increasing heat fluxes at the chip and package levels complicate the problem. Although significant advances have been made in air cooling techniques to manage increased heat fluxes, it has long been recognized that significantly higher heat fluxes are better accommodated through the use of liquid cooling.

FIG. 1 shows a prior art electronic device 100 having a cavity-up design. A flip-chip 106 is bonded to a substrate 102 via flip-chip bumps 108. A lid 110, which can be multi-component or one component is attached to substrate 102 via adhesive 112. The lid 110 provides mechanical structure strength to the device. A cold plate 116 is attached to lid 110 with an adhesive 120 or other known securing means. A cold plate 116 is constructed of a cap 116a and a base 116b. The base 116b includes fins 116c and cap 116a includes an inlet 122 and an outlet 124. The cap 116a is attached to base 116b through an adhesive 121, forming channels 116d. The electronic device 100 may be coupled to a printed circuit board (PCB) via Ball Grid Array (BGA) balls 104.

FIG. 2 shows a prior art electronic device 100 having a bond wire configuration. A chip 106 is electrically connected to a plurality of pins 19 within a substrate 102 by a plurality of bond wires 16. The chip 106 is attached to a lid 110 attached within the substrate 102. A cold plate 116 is attached to lid 110 with an adhesive 120 or other known securing means similar to the device illustrated in FIG. 1 of the drawings.

In FIG. 1, the thermal path for dissipating heat generated by flip-chip 106 includes adhesive 114, lid 110 and adhesive 120. In FIG. 2, the thermal path for dissipating heat generated by the chip 106 includes adhesive 114, lid 110 and adhesive 120. Each junction/interface (e.g., between chip 106 and lid 110, between lid 110 and cold plate 116) causes a junction temperature which is undesirable because junction temperatures increase the impedance of the thermal path, thus decrease thermal dissipation efficiency.

In some instances, where thermal requirements cannot be met with the added junction temperature caused by the adhesive between the lid and the adhesives, the lid may be eliminated all together and a cold plate directly attached to the silicon substrate. Although the resulting structure eliminates the junction temperature caused by the lid, the elimination of the lid also eliminates the mechanical strength provided by the lid, resulting in a weak structure.

While these devices may be suitable for the particular purpose to which they address, they are not as suitable for reducing the number of junctions in a packaged integrated circuit device. Conventional heat dissipation systems have numerous junctions within the thermal path thereby increasing thermal impedance and decreasing thermal dissipation efficiency.

In these respects, the integrated circuit heat dissipation system according to the present invention substantially departs from the conventional concepts and designs of the prior art, and in so doing provides an apparatus primarily developed for the purpose of reducing the number of junctions in a packaged integrated circuit device.

BRIEF SUMMARY OF THE INVENTION

In view of the foregoing disadvantages inherent in the known types of heat dissipation systems now present in the prior art, the present invention provides a new integrated circuit heat dissipation system construction wherein the same can be utilized for reducing the number of junctions in packaged integrated circuits thereby decreasing thermal impedance and increasing thermal dissipation efficiency.

The general purpose of the present invention, which will be described subsequently in greater detail, is to provide a new integrated circuit heat dissipation system that has many of the advantages of the heat dissipation devices mentioned heretofore and many novel features that result in a new integrated circuit heat dissipation system which is not anticipated, rendered obvious, suggested, or even implied by any of the prior art heat dissipation systems, either alone or in any combination thereof.

To attain this, the present invention generally comprises lid attached to a substrate, a cap attached about the lid creating a heat dissipation chamber, and a semiconductor chip attached to the lid by a thermally conductive adhesive. The lid may or may not form a cavity about the semiconductor chip depending upon the substrate utilized. The lid preferably includes a plurality of fins extending from thereof defining a plurality of channels or a plurality of grooves thereby increasing the heat flux of the lid.

There has thus been outlined, rather broadly, the more important features of the invention in order that the detailed description thereof may be better understood, and in order that the present contribution to the art may be better appreciated. There are additional features of the invention that will be described hereinafter and that will form the subject matter of the claims appended hereto.

In this respect, before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. Also, it is to be understood that the phraseology and terminology employed herein are for the purpose of the description and should not be regarded as limiting.

A primary object of the present invention is to provide an integrated circuit heat dissipation system that will overcome the shortcomings of the prior art devices.

A second object is to provide an integrated circuit heat dissipation system for reducing the number of junctions in packaged integrated circuits thereby decreasing thermal impedance and increasing thermal dissipation efficiency.

Another object is to provide an integrated circuit heat dissipation system that may be utilized within various integrated circuit packages.

An additional object is to provide an integrated circuit heat dissipation system that increases the performance of an integrated circuit.

A further object is to provide an integrated circuit heat dissipation system that may be utilized within various integrated circuit devices.

Other objects and advantages of the present invention will become obvious to the reader and it is intended that these objects and advantages are within the scope of the present invention.

To the accomplishment of the above and related objects, this invention may be embodied in the form illustrated in the accompanying drawings, attention being called to the fact, however, that the drawings are illustrative only, and that changes may be made in the specific construction illustrated and described within the scope of the appended claims.

BRIEF DESCRIPTION OF THE DRAWINGS

Various other objects, features and attendant advantages of the present invention will become fully appreciated as the same becomes better understood when considered in conjunction with the accompanying drawings, in which like reference characters designate the same or similar parts throughout the several views, and wherein.

Figure 1:
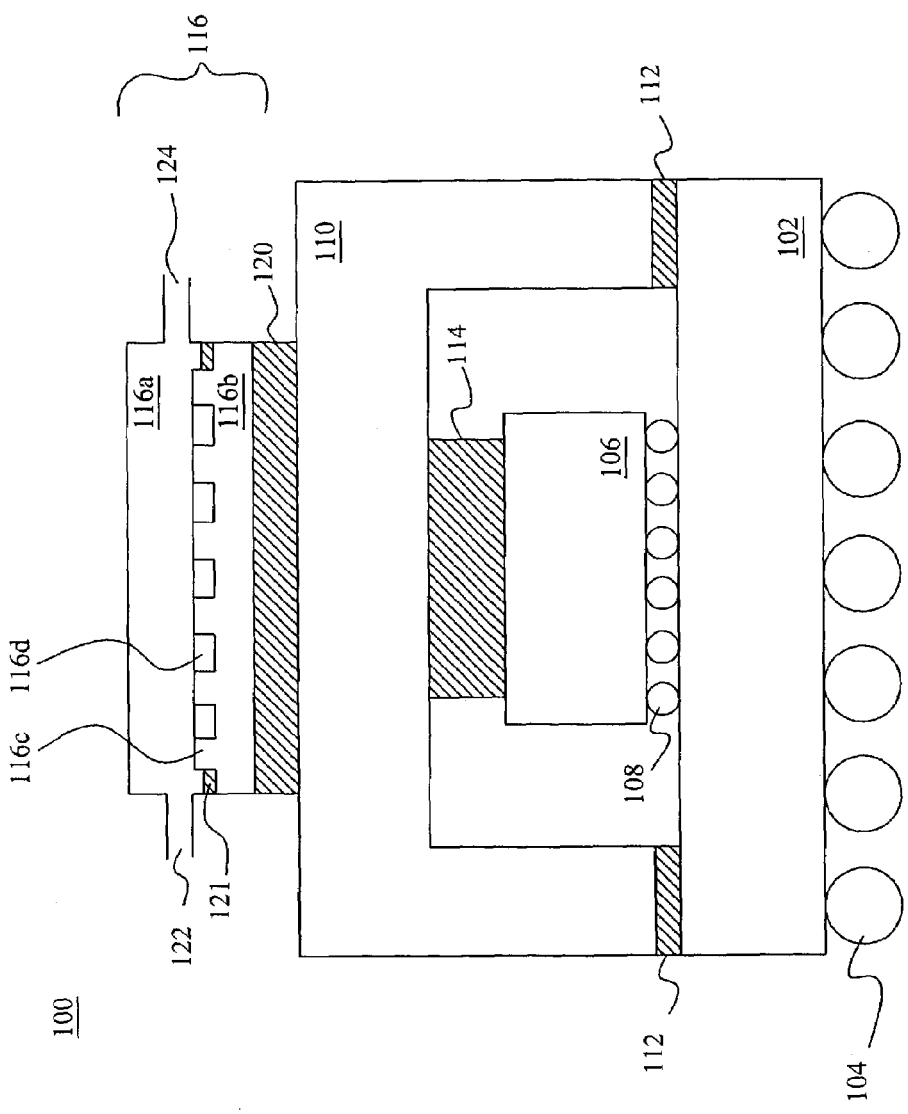
FIG. 1 illustrates a prior art integrated circuit device package (flip-chip configuration) coupled to a heat dissipation member through an adhesive.
Figure 2:
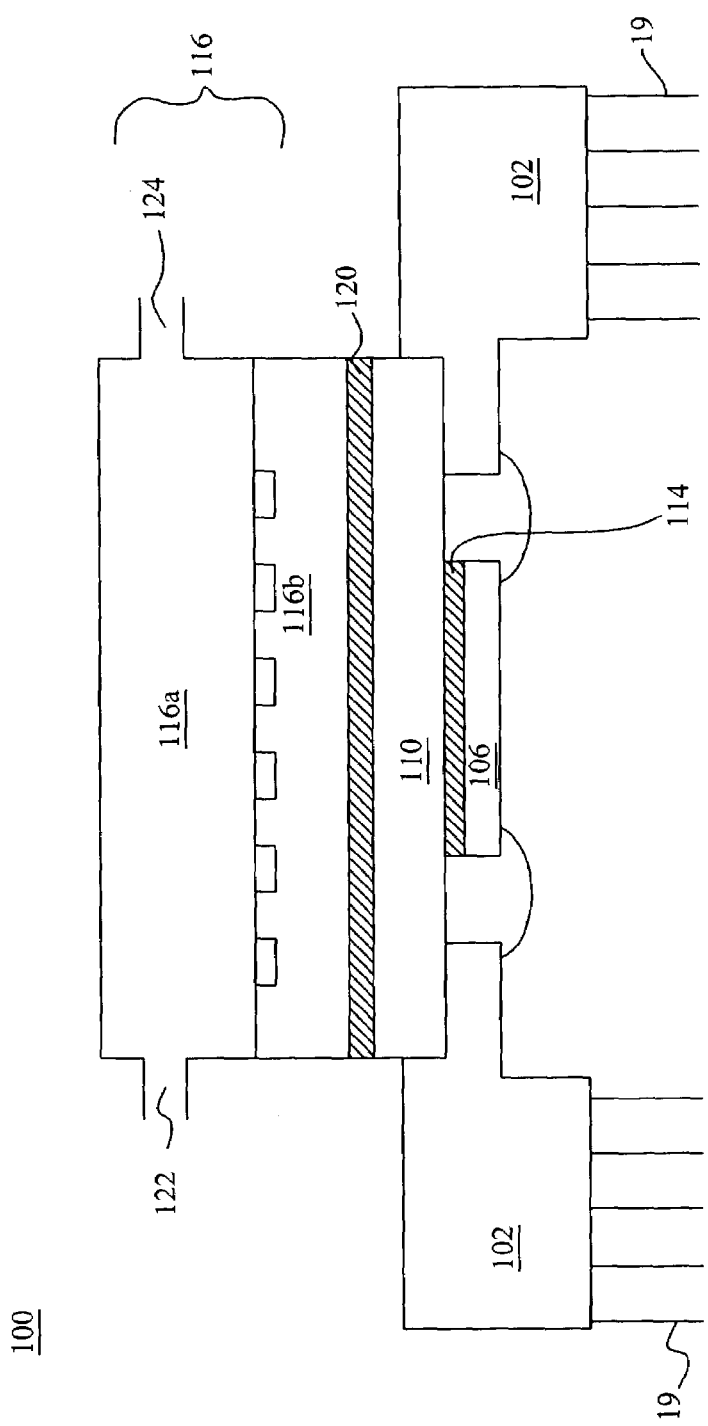
FIG. 2 illustrates a prior art integrated circuit device package (bond wire configuration) coupled to a heat dissipation member through an adhesive.

While specific embodiments are described and illustrated herein, these embodiments are not intended to limit the scope of the invention, which is susceptible to various modifications and alternative forms.

DETAILED DESCRIPTION OF THE INVENTION

A. Overview

Turning now descriptively to the drawings, in which similar reference characters denote similar elements throughout the several views, FIGS. 1 through 18 illustrate an integrated circuit heat dissipation system 10, which comprises lid attached to a substrate, a cap attached about the lid creating a heat dissipation chamber, and a semiconductor chip attached to the lid by a thermally conductive adhesive. The lid may or may not form a cavity about the semiconductor chip depending upon the substrate utilized. The lid preferably includes a plurality of fins extending from thereof defining a plurality of channels or a plurality of grooves thereby increasing the heat flux of the lid.

A conventional cold plate is formed by gluing or brazing a cap and a bottom piece together. The cold plate is then attached to a lid through an adhesive material. In contrast to the conventional cold plate, the bottom piece of the cold plate in accordance with the present invention is integrated with the lid. The cap is then glued or brazed to the combined lid/bottom piece. The interface area and junction between the lid and the cap is minimal.

B. Semiconductor, Substrate and Packaging

The semiconductor chip 12 may include integrated circuitry fabricated on a monocrystalline silicon substrate. The integrated circuitry on semiconductor chip 12 may be electrically connected to chip solder bump array 13 via a multi-layer interconnect structure (not shown) which is fabricated over a silicon substrate in accordance with conventional semiconductor processing techniques. The chip solder bump array 13 is also electrically connected to electrically conductive traces (not shown) which are located on the upper surface of substrate 18.

Figure 3:
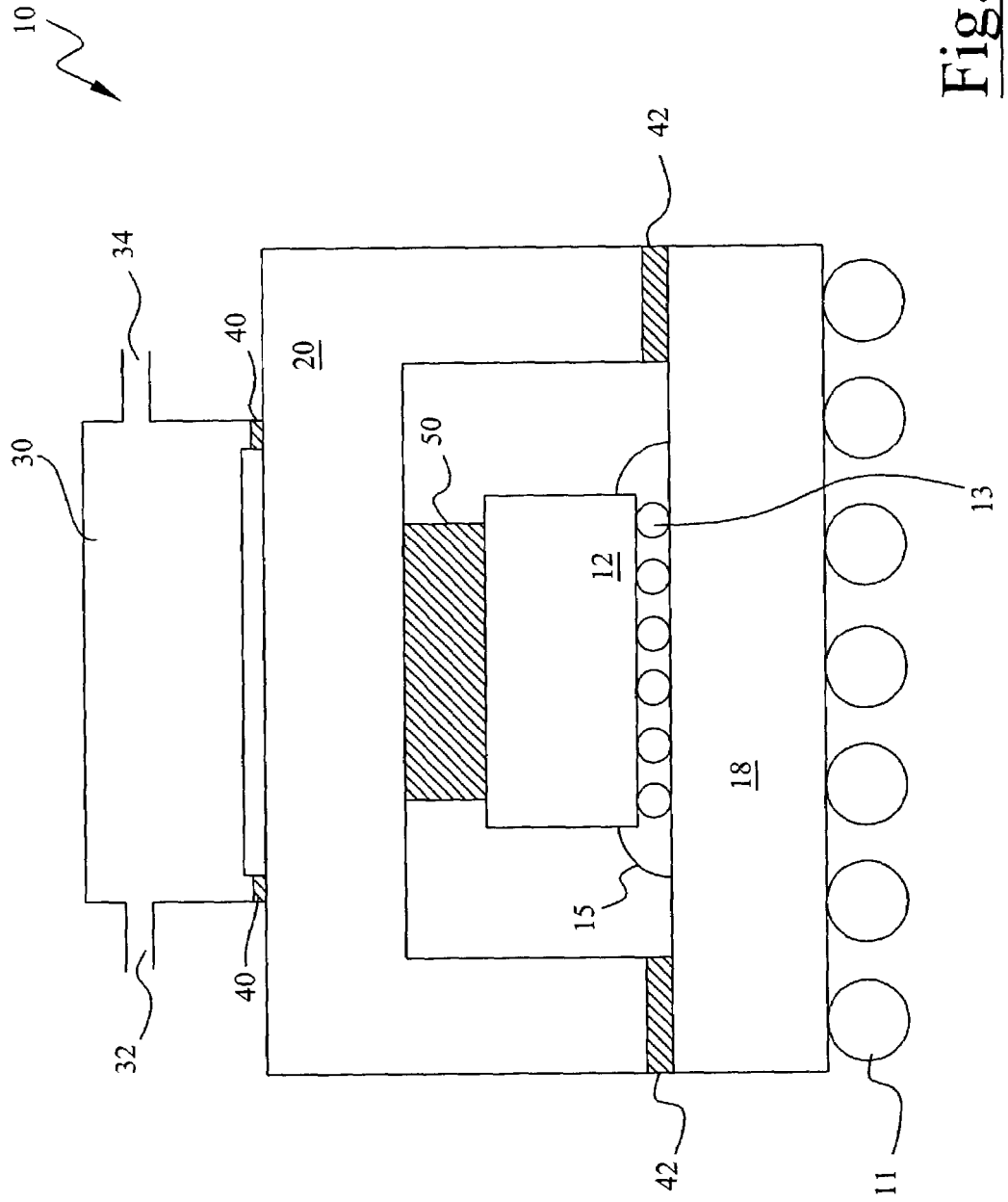
FIG. 3 is a side cutaway view of the present invention within a flip-chip configuration.

The underfill 15, which is typically epoxy resin, is preferably located around the perimeter of semiconductor chip 12 as shown in FIG. 3. The underfill 15 joins semiconductor chip 12 to the interconnect structure in substrate 18 and adds rigidity and strength to substrate 18. The underfill 15 may be other suitable materials which are commonly utilized within the industry.

The semiconductor chip 12 and bond wires 16 may be protected with an encapsulant 14. The encapsulant 14 may be, for example, a potting resin such as an epoxy resin similar to that used in a plastic package. The encapsulant can be provided by screen printing or other known techniques. Those skilled in the art would recognize other variations. For example, a metal or ceramic lid may be used instead of the encapsulant 14, with solder or adhesive to attach the lid to substrate 18.

The substrate 18 may include alternating layers of electrically insulating material and electrically conductive traces (not shown) which are connected in a manner known in the art, to provide conductive pathways from the upper surface of substrate 18 to the lower surface of substrate 18. The conductive layers of substrate 18 may be copper and the insulating layers may be comprised of conventional fire retardant resin-glass cloth laminate. Alternatively, the substrate 18 may include alternating layers of copper and insulating epoxy. Other suitable combinations of electrically conductive and insulating materials may also be used to construct the substrate 18.

The conductive layers of substrate 18 typically extend to the lower surface of substrate 18. The solder balls of package solder ball array 11 provide electrically conductive paths between the conductive traces on the lower surface of substrate 18 and conductive traces located on the upper surface of a printed circuit board (PCB, not shown).

FIG. 3 illustrates a ball grid array (BGA) packaged integrated circuit in accordance with one embodiment of the present invention. FIG. 3 further illustrates the semiconductor chip 12 mounted in a conventional flip-chip configuration. The flip-chip configuration is a surface mount technology where the semiconductor chip 12 is packaged in place on a substrate 18 with an underfill 15. The flip-chip 12 may also be mounted on glass substrates using conductive paste, typically for LCD drivers and smart cards.

Figure 4:
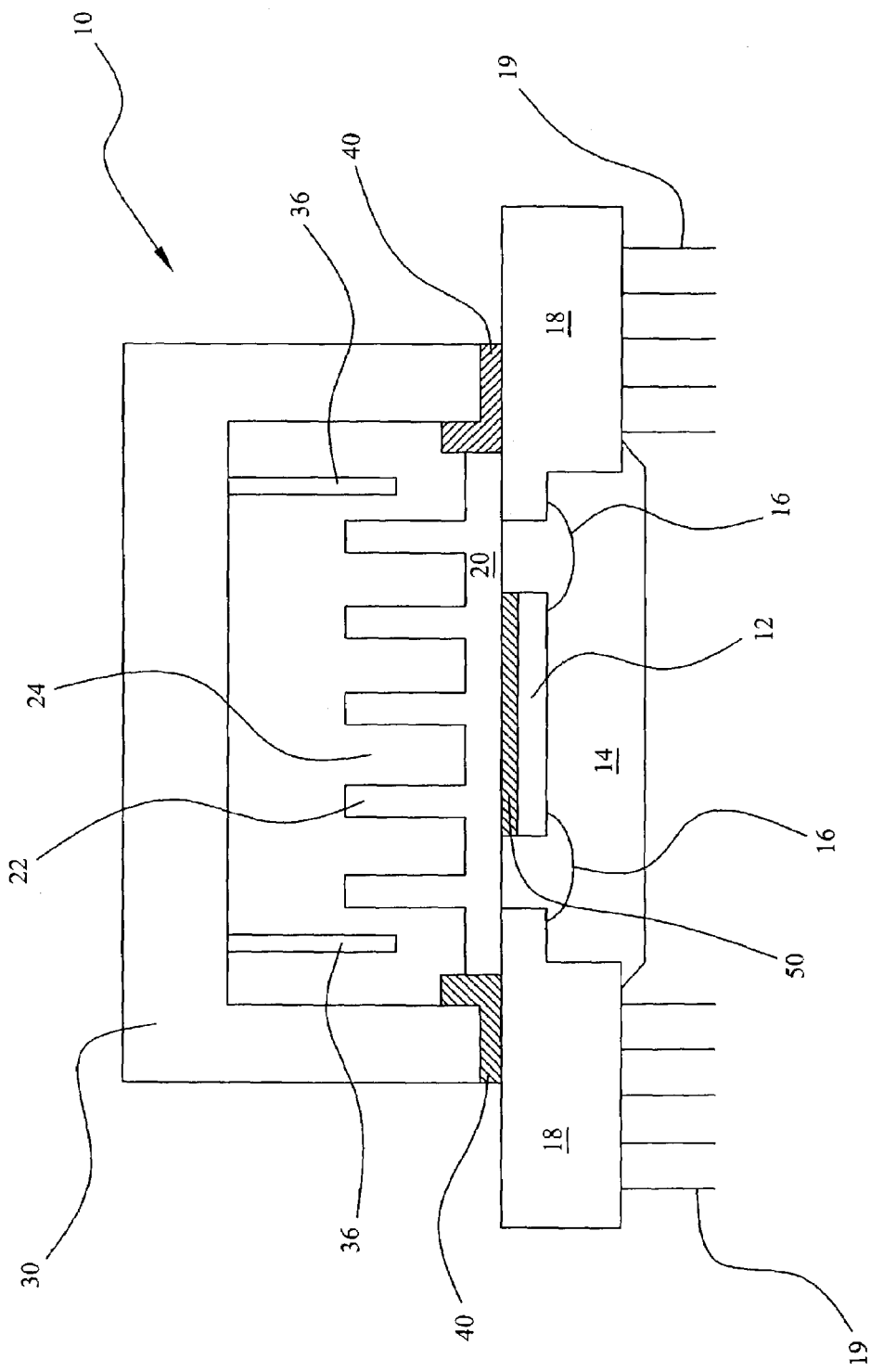
FIG. 4 is a side cutaway view of the present invention within a bond wire configuration.
Figure 5:
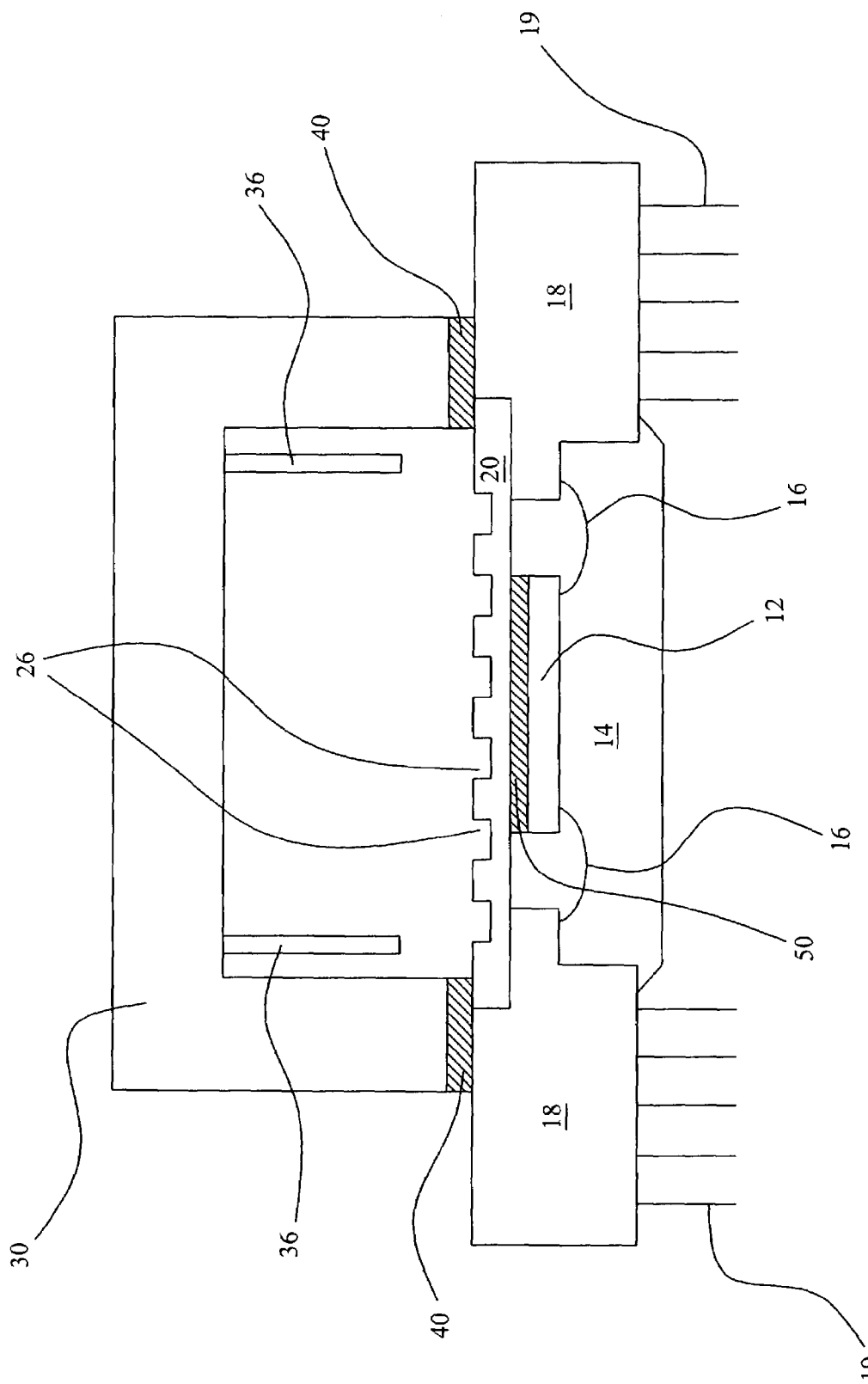
FIG. 5 is a side cutaway view of the present invention with a plurality of grooves within the lid.

Other types of package may be used, for example, wire bond BGA, Pin Grid Array (PGA), Land Grid Array (LGA) or ceramic column grid array (CCGA). FIGS. 4 and 5 illustrate a pin grid array package in accordance with one embodiment of the present invention. In this embodiment, bond wires 16 provide electrical connections between substrate 18 and semiconductor chip 12. Pins 19 provide electrical connections between substrate 18 and a printed circuit board (PCB—not shown) or other device.

C. Thermally Conductive Lid

A thermally conductive lid 20 is attached to an upper surface (i.e., the backside) of semiconductor chip 12 via a thermally conductive adhesive 50. The thermally conductive lid 20 may be formed of aluminum, copper, copper tungsten, copper molybdenum, CVD diamond or other suitable materials. The thermally conductive lid 20 also provides mechanical strength to the overall structure. The thermally conductive lid 20 may have various sizes, shapes and thickness.

In the embodiment shown in FIG. 3, the thermally conductive lid 20 includes portions which extend downward toward substrate 18 forming a cupped structure. A second adhesive 42 connects the downward extending portions of thermally conductive lid 20 to the substrate 18 to define a cavity (e.g. fully closed cavity or partially closed cavity) which surrounds the semiconductor chip 12 as shown in FIG. 3. The second adhesive 42 may have a composition similar to that of the thermally conductive adhesive 50.

Figure 8:
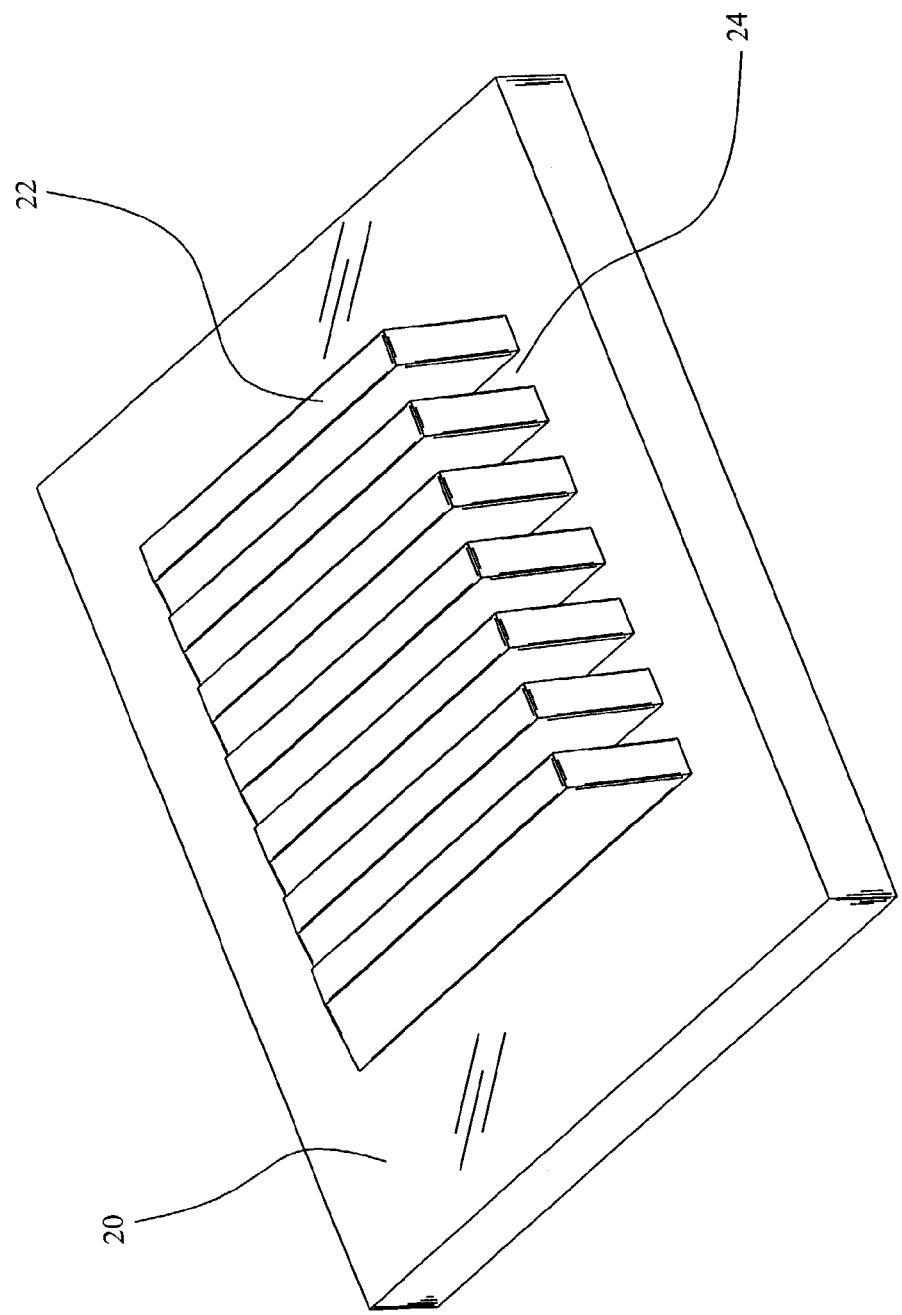
FIG. 8 is an upper perspective view of the lid having a plurality of fins.
Figure 9:
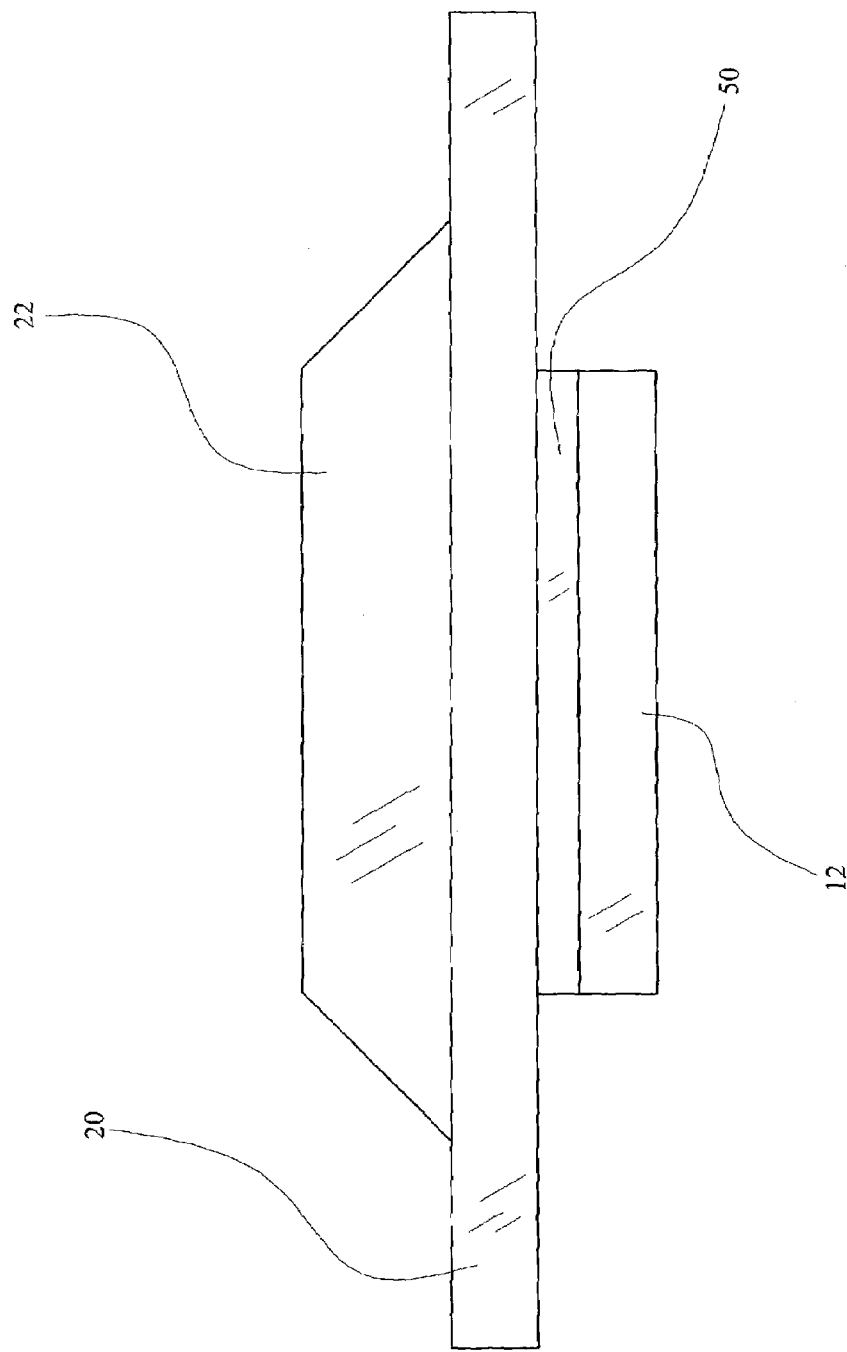
FIG. 9 is a side view of the lid with a semiconductor chip attached thereto.
Figure 10:
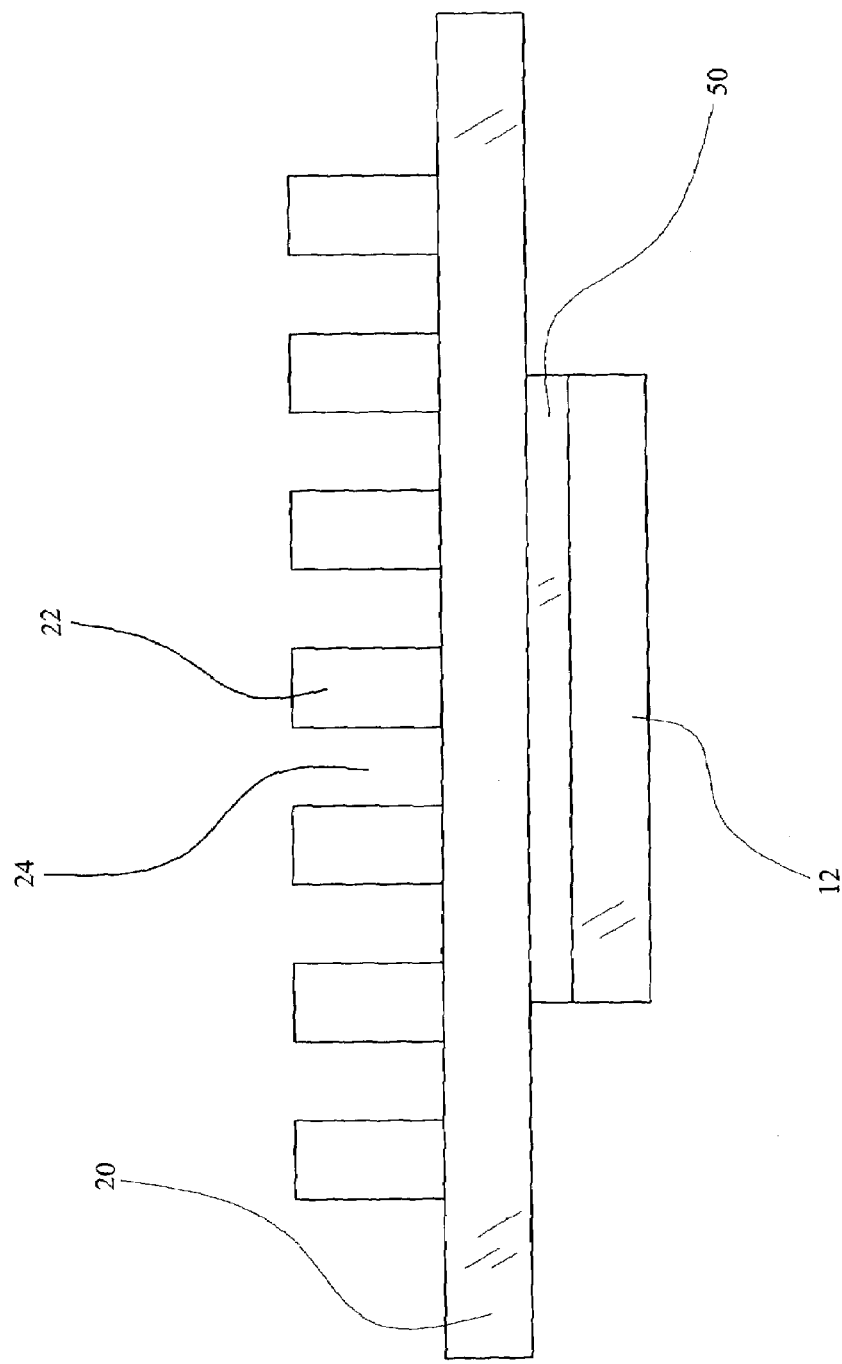
FIG. 10 is an end view of the lid with a semiconductor chip attached thereto.
Figure 11:
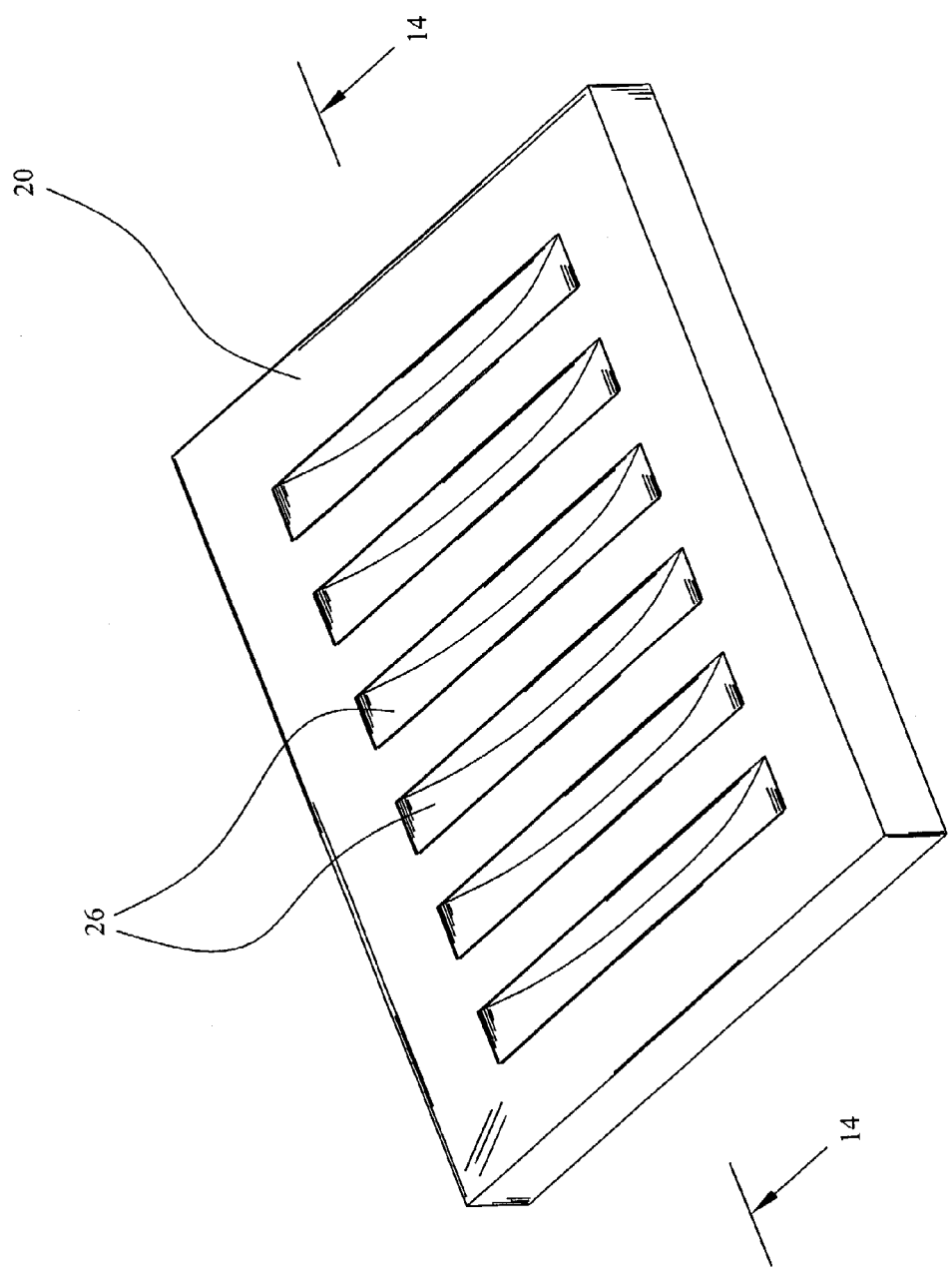
FIG. 11 is an upper perspective view of the lid with a plurality of grooves within.
Figure 12:
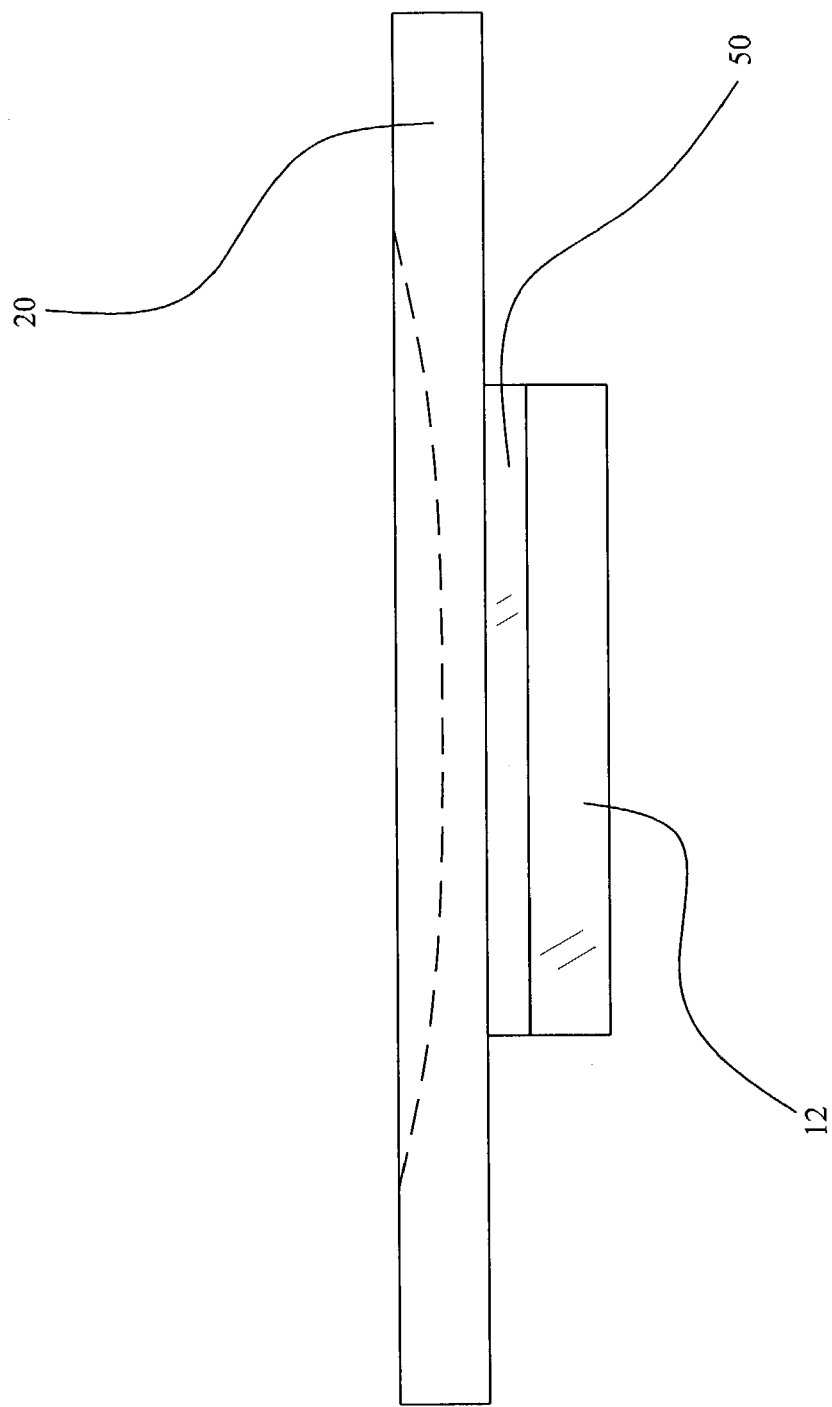
FIG. 12 is a side view of the lid with a semiconductor chip attached thereto.
Figure 13:
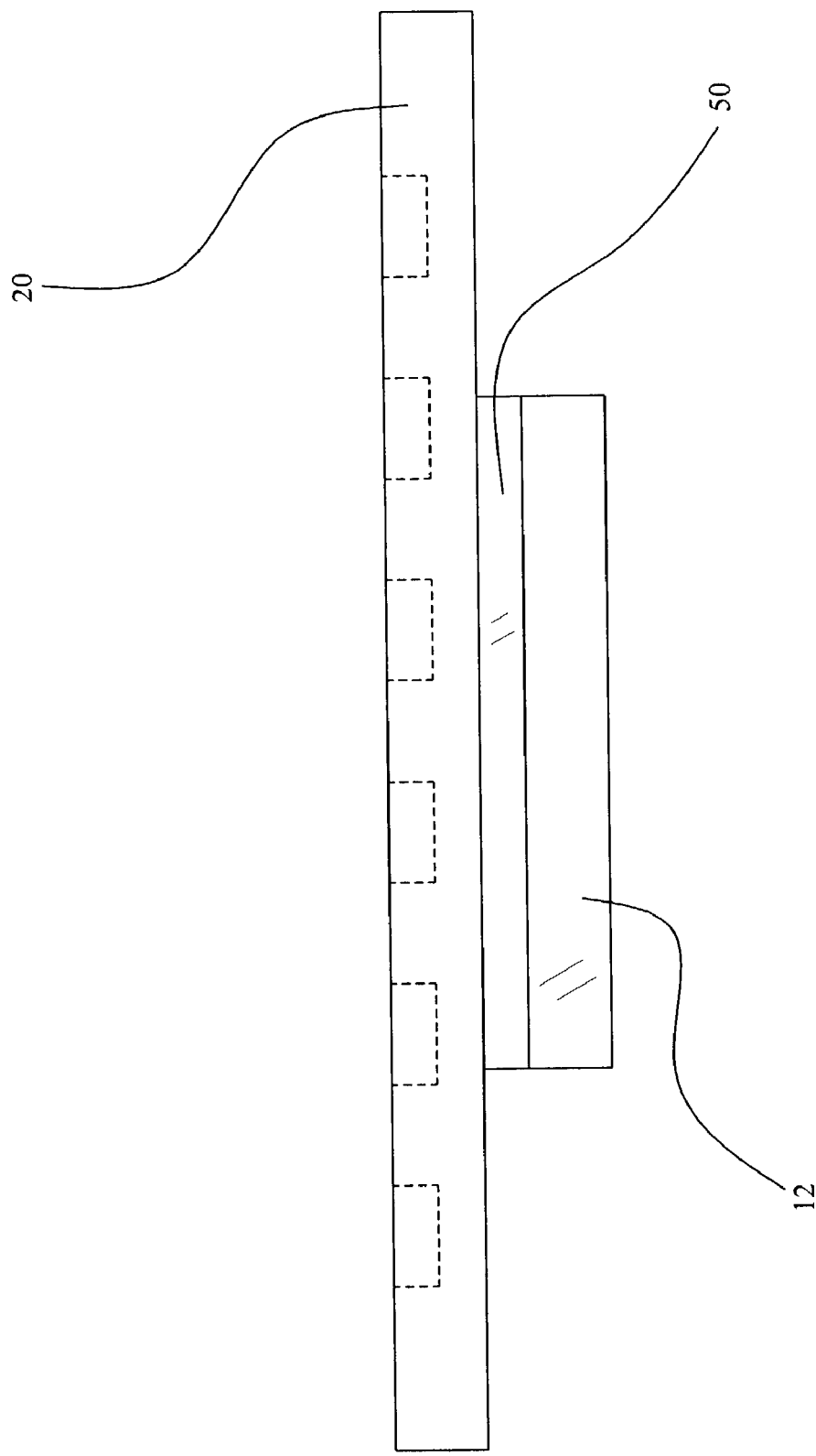
FIG. 13 is an end view of the lid with a semiconductor chip attached thereto.
Figure 14:
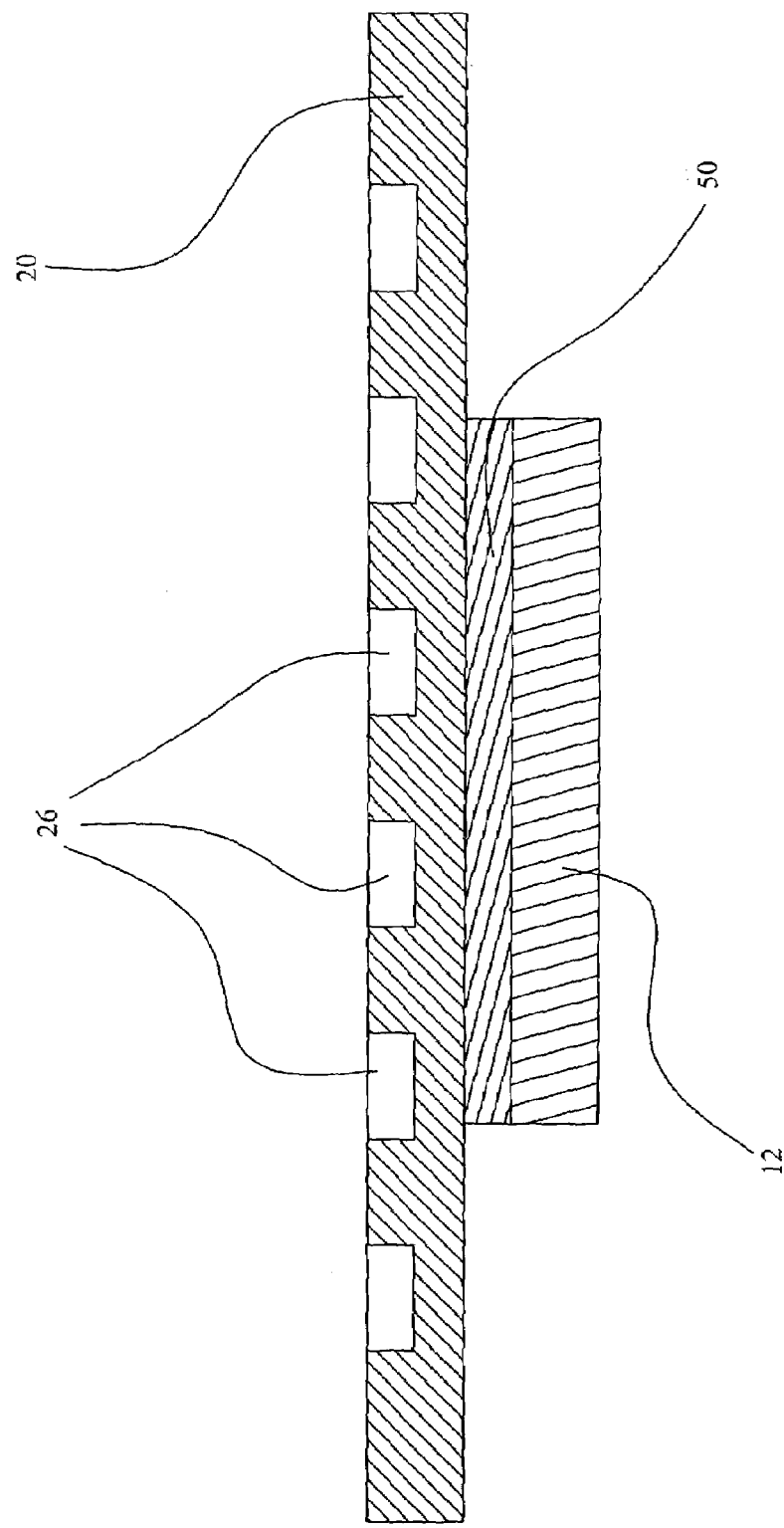
FIG. 14 is a cross sectional view taken along line 14—14 of FIG. 11.
Figure 15:
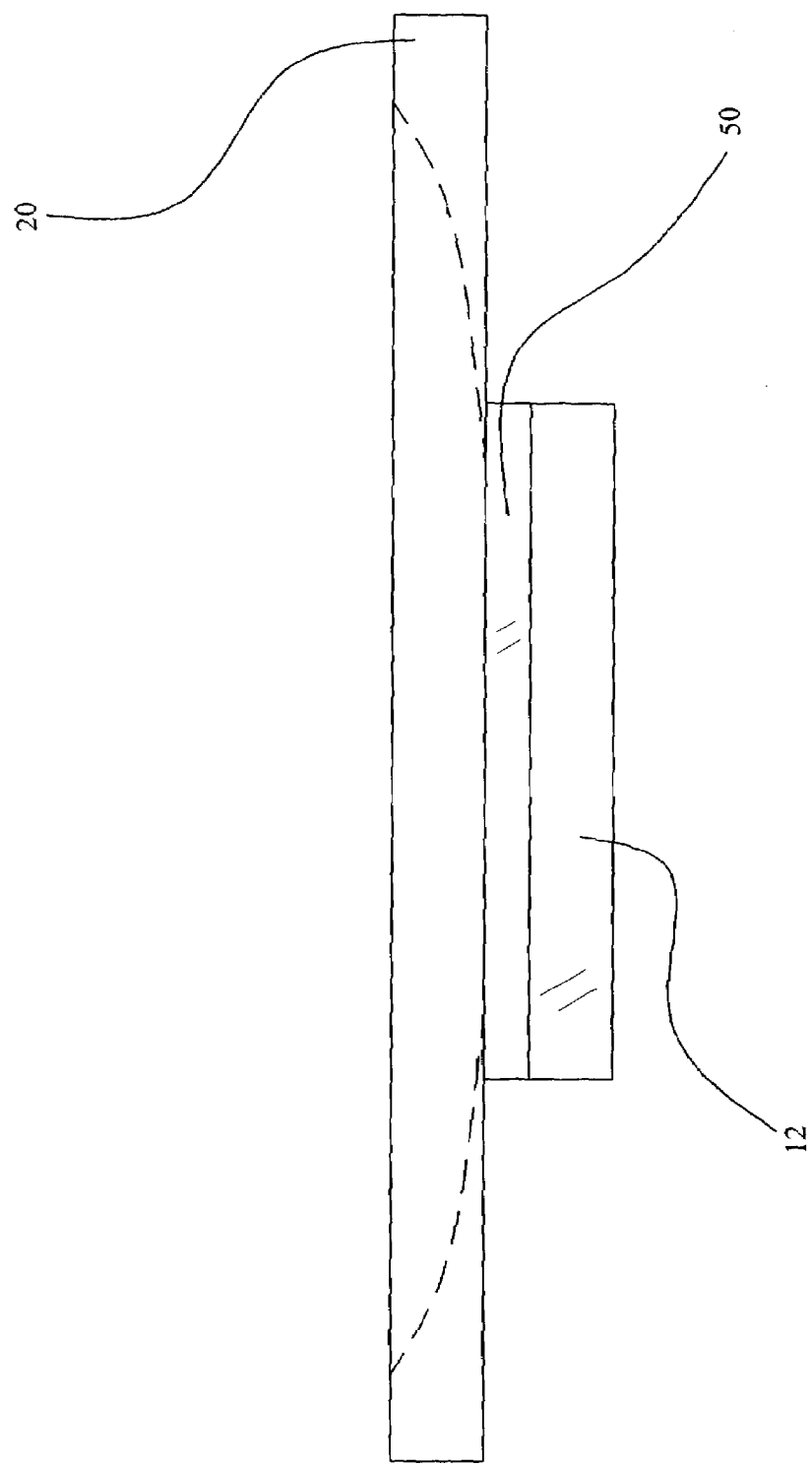
FIG. 15 is a side view of an alternative embodiment of the lid having a plurality of channels that extend completely through the lid.
Figure 16:
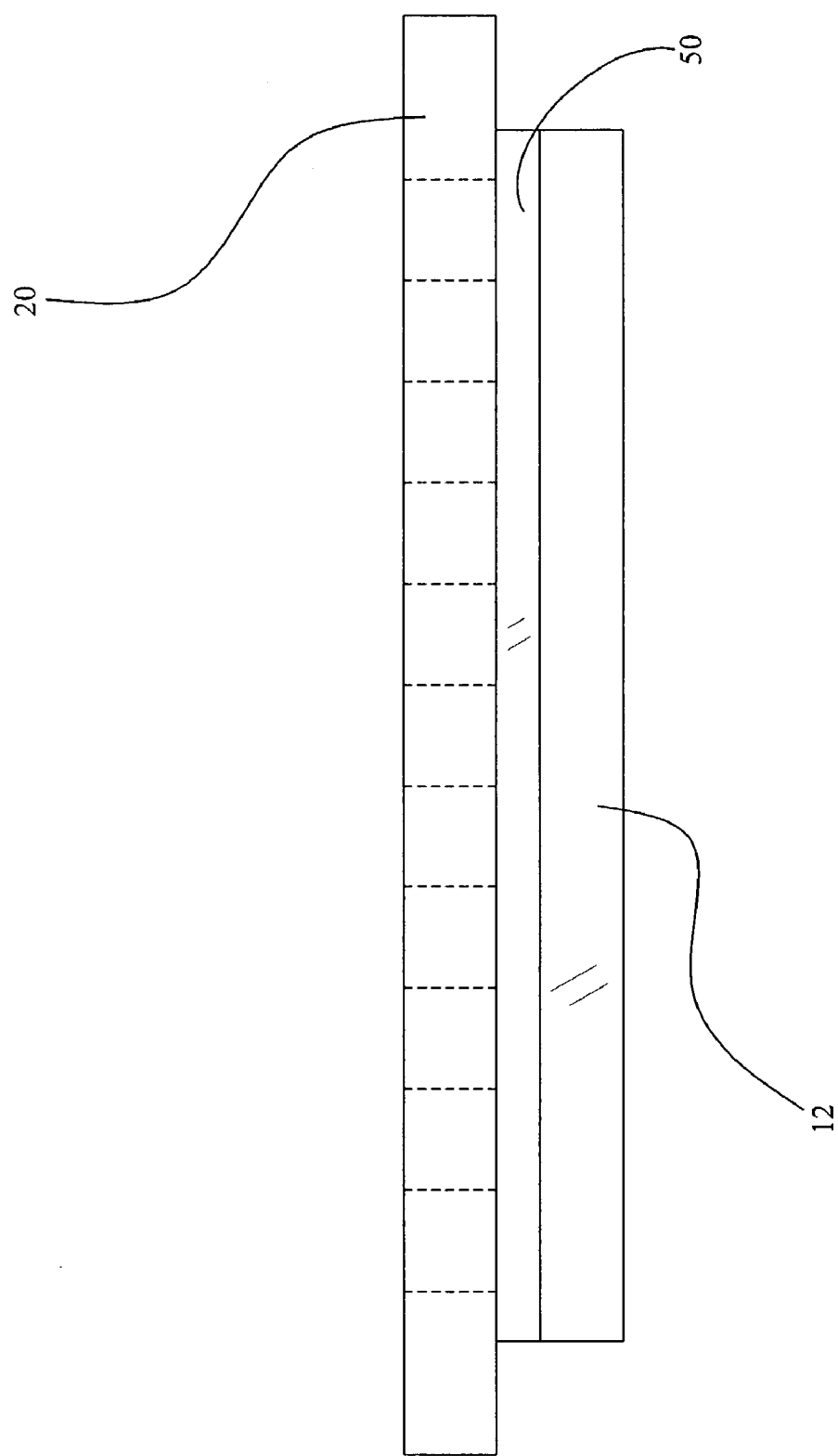
FIG. 16 is a side view of the alternative embodiment of the lid.
Figure 17:
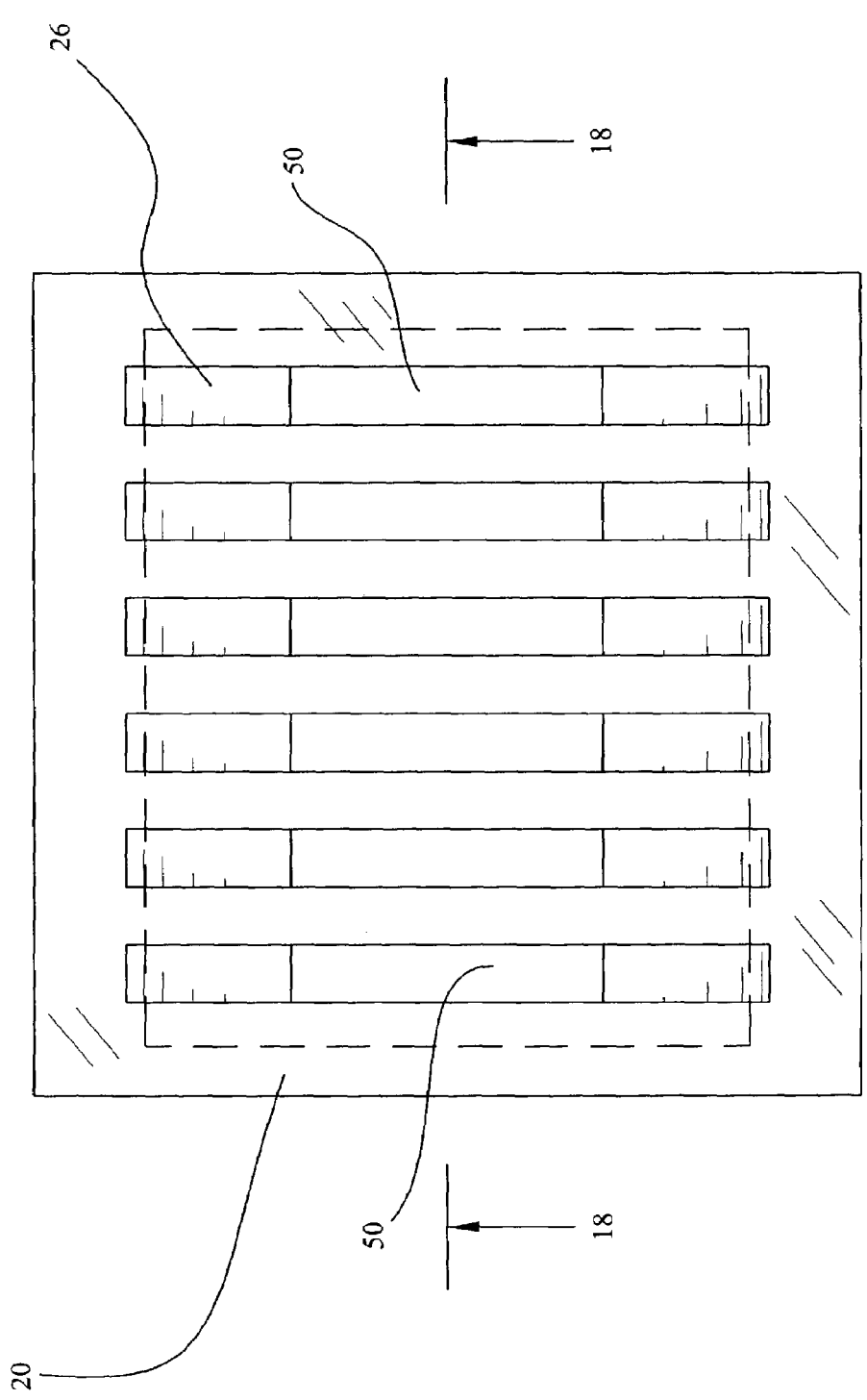
FIG. 17 is a top view of the alternative embodiment with the semiconductor chip attached thereto.
Figure 18:
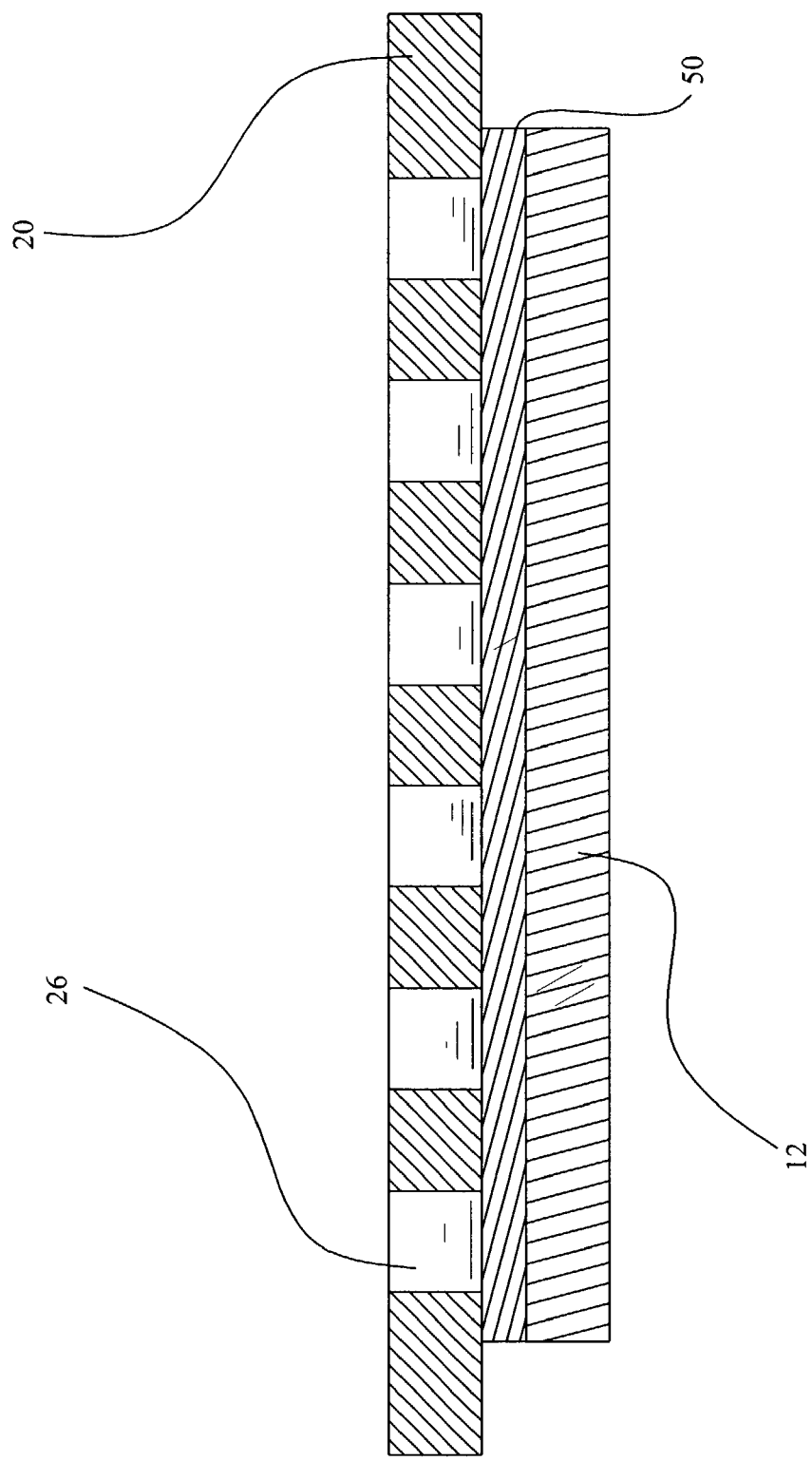
FIG. 18 is a cross sectional view taken along line 18—18 of FIG. 16.

The thermally conductive lid 20 may have a planar upper surface as shown in FIG. 3 of the drawings. FIG. 4 illustrates the lid 20 having a plurality of fins 22 protruding from the thermally conductive lid 20 thereby defining a plurality of channels 24 between thereof. The fins 22 may have narrow elongate structures as shown in FIGS. 8 through 10 of the drawings. The fins 22 may have various other shapes, sizes, patterns and structures capable of dissipating heat conducted by the lid 20 from the semiconductor chip 12 such as but not limited to nubs, narrow extended members, conical members, triangular, polygonal, curved, slanted, angled, tubular, cylindrical and pyramid shaped.

Alternatively to utilizing the fins 22 within the upper surface of the thermally conductive lid 20, a plurality of grooves 26 may be extended into the upper surface as shown in FIGS. 11 through 18 of the drawings. The grooves 26 may have various widths, lengths and depths as can be appreciated. The grooves 26 may have curved, straight or polygonal side structures.

Portions of the grooves 26 may extend through the lid 20 completely forming openings 28 within the lid 20 for allowing direct contact between the thermally conductive adhesive 50 and the coolant as illustrated in FIGS. 15 through 18 of the drawings. In this embodiment, it is important that the thermally conductive adhesive 50 completely encloses the openings 28 to prevent coolant from escaping.

D. Thermally Conductive Adhesive

The thermally conductive adhesive 50 should be compatible with the lid material and may be any conventional thermally conductive adhesives (paste or tape), greases or solder materials. In general, thermally conductive adhesive 50 should have high dielectric strength, high thermal conductivity and sufficient pliancy to conform to both microscopic and macroscopic surface irregularities of semiconductor chip 12 and thermally conductive lid 20.

The thermally conductive adhesive 50 should also be sufficiently durable to survive a variety of assembly, use, and environmental conditions. The optimal adhesive material for a specific application generally depends on volume production requirements, processing limitations, and functional and performance requirements (e.g., thermal transfer rates vs. cost).

The thermally conductive adhesive 50 may be thermal greases, pads and adhesives with filler materials (i.e., conductive metal particles) such as, but not limited to, zinc oxide, silver, aluminum, aluminum oxide, aluminum nitride, boron nitride, magnesium oxide, and diamond. For example, thermally conductive adhesive 50 may be epoxy, silicone or polyimide filled with silver. The thickness of thermally conductive adhesive 50 depends on the type of the adhesive chosen and the specific use. Heat generated by semiconductor chip 12 during normal operating conditions is transferred to thermally conductive lid 20 through thermally conductive adhesive 50.

E. Cap

The combination of a lid 20 and fins 22 or grooves 26 also act as the bottom plate of a conventional cold plate. A cap 30 with an inlet 32 and an outlet 34 is attached to the thermally conductive lid 20 and/or substrate 18 using, for example, a first adhesive 40 around the perimeter of cap 30. The cap 30 may also be attached to the lid 20 via various other securing methods such as but not limited to solder, fastener devices or other fasteners. The cap 30 acts as the top plate of a conventional cold plate.

The cap 30 may also be attached to thermally conductive lid 20 by using, for example, welding, brazing, soldering or diffusion bonding. If solder is chosen, solder melting temperature should be lower than the melting point of the chip solder bump array 13 so that the solder does not remelt during the reflow process, e.g., below 183 degrees Celsius for tin solder. Those skilled in the art would recognize that solder melting temperature is not a concern if the lid and cap are joined prior to attachment to the package.

The cap 30 may be attached to thermally conductive lid 20 during the packaging process. In the alternative, cap 30 may be attached to thermally conductive lid 20 during the lid manufacturing process and the lid/cap combination is then attached to substrate 18 during the packaging process.

The dimensions of cap 30, inlet 32 and outlet 34 depend on specific construction and are application specific. Heat may be dissipated from semiconductor chip 12 to the combined lid/bottom piece. The coolant flow enters inlet 32, through plenums into channels 24, then exits outlet 34 to assist heat dissipation from semiconductor chip 12.

The coolant may be comprised of a dielectric or non-dielectric substance such as, but is not limited to, water, air, freon, and fluorinated carbon liquids (e.g., FC-72, FC-86, FC-77, etc.). Various other coolants may be utilized within the present invention.

The structures shown in FIGS. 3, 4 and 5, effectively eliminate or minimize junction temperature caused by adhesives between a cold plate and a lid. For a high performance semiconductor chip such as a central processing unit (CPU), the elimination or minimization of this junction between thermally conductive lid 20 and cap 30 can reduce the junction temperature significantly, e.g., 10 to 15 degrees centigrade. In general, the amount of heat reduced is proportional to power output of the semiconductor chip. Therefore, the higher performance the semiconductor, the more power it dissipates, and the larger reduction in junction temperature.

F. Spray Cooling

In one embodiment, the cap 30 may be implemented with nozzles/atomizers for spray cooling. In some embodiments, radial nozzles and open pipes may be used where impinging jets are used. Spray cooling, which uses evaporation to remove heat from the device, is generally more effective than traditional liquid cooling which utilizes convection cooling.

Using a cap 30 with built-in inlet nozzles, the nozzles may spray a fine atomized mist of coolant onto the lid 20. The liquid coolant picks up heat and evaporates, cooling the lid 20 and the semiconductor chip 12. The size of the nozzles may vary. In general, any suitable cooling nozzles for electronic cooling may be used which are well known in the art. Depending on the effectiveness of the heat transfer and the heat transfer requirements, a spray cooled system may eliminate fins or use micron sized fins instead of protruding fins on the bottom piece that is integrated into lid 20. Other types of cooling may be used, for example air cooling.

Figure 6:
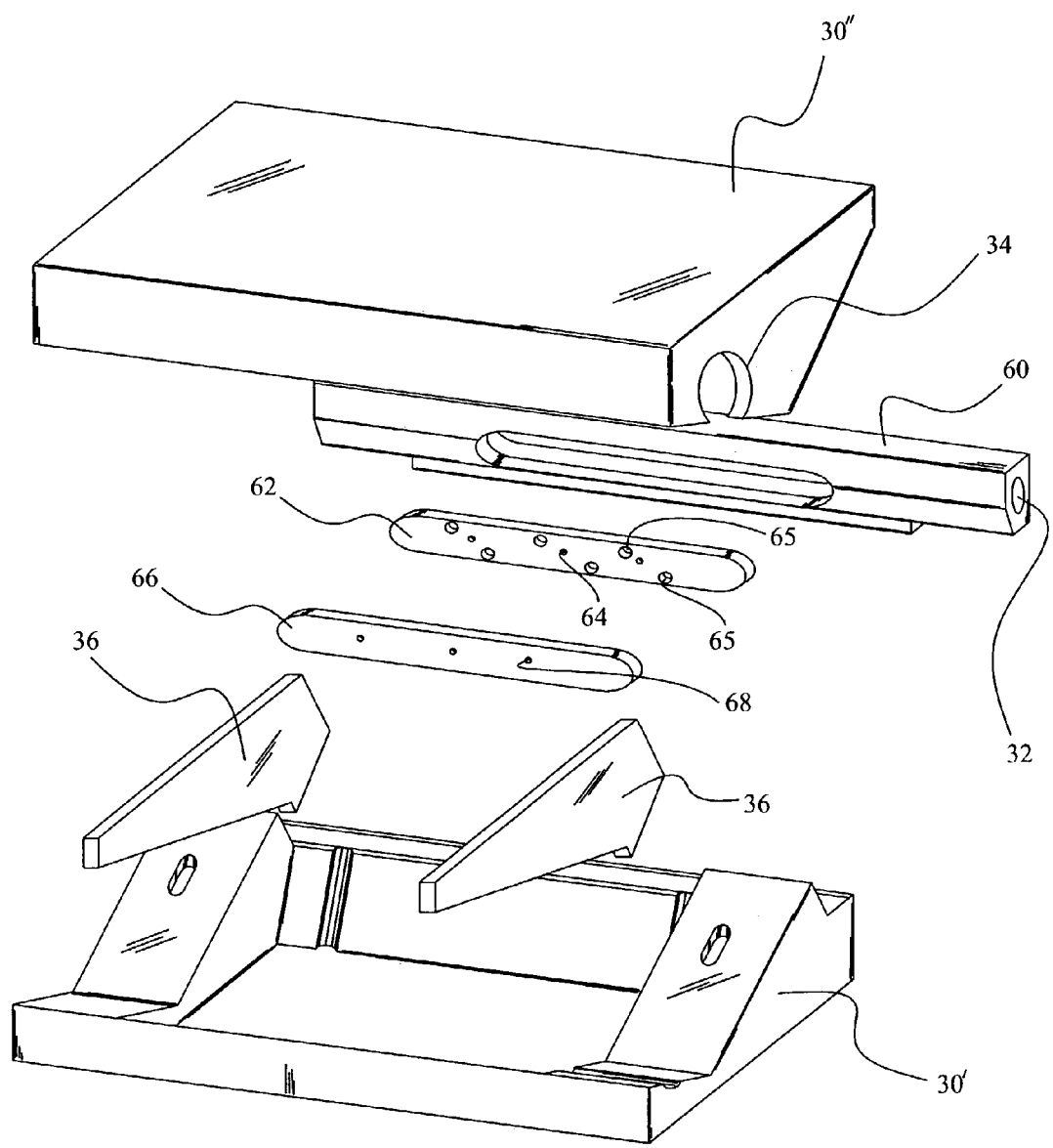
FIG. 6 is an exploded upper perspective view of the cap including a spray unit.
Figure 7:
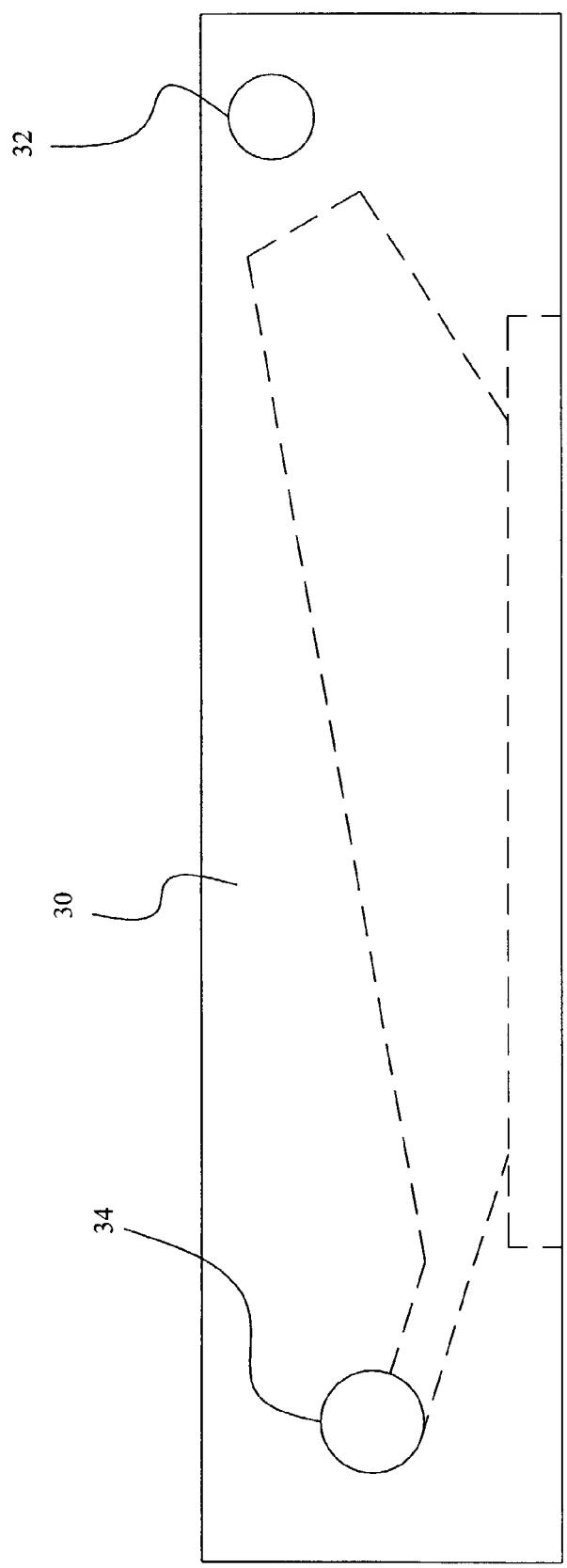
FIG. 7 is a side view of the cap.

FIG. 6 illustrates an exemplary spray cooling assembly for the cap 30. The cap 30 may be comprised of a single structure or a combination of a lower portion 30' and an upper portion 30" as further shown in FIG. 6 of the drawings. The spray unit 60 within the cap 30 has an inlet 32 which receives the pressurized coolant. The coolant then enters inlet ports 64 and swirl ports 65 within an inlet plate 62 which direct the coolant through outlet nozzles within an outlet plate 66 as shown in FIG. 6 of the drawings. Various other nozzle structures may be utilized with the present invention to generate the spray cooling. The liquid and vaporized coolant is thereafter removed through the outlet 34 for thermal conditioning to a desired temperature before being returned to the inlet 32. Since a low pressure zone is created near the spray unit 60, one or more fences 36 are preferably positioned within the cap 30 for preventing liquid coolant from returning to the spray unit 60 while allowing the vaporized coolant to return as shown in FIGS. 4, 5 and 6 of the drawings.

G. Operation

The semiconductor chip 12 is operated in the desired manner within a PCB or other device. As the semiconductor chip 12 increases in temperature, the lid 20 conducts the heat through the thermally conductive adhesive 50. The lid 20 thereafter dissipates the conducted heat through the upper surface of the lid 20 to the coolant flowing between the cap 30 and the lid 20. Fins 22 and grooves 26 within the lid 20 create increased surface area which thereby increases the efficiency of the heat transfer to the coolant.

In general, any integrated circuit device package in which there is contact (either direct or indirect) between the semiconductor chip 12 and a thermally conductive body that forms the top surface of the package opposing the contact side may benefit from the method and structure described above which may be implemented in various systems. For example, the above described structures may be mounted on a PCB which may be the motherboard for a computer.

While the present invention has been described with reference to particular figures and embodiments, it should be understood that the description is for illustration only and should not be taken as limiting the scope of the invention. Many changes and modifications may be made to the invention, by one having ordinary skill in the art, without departing from the spirit and scope of the invention. For example, additional heat dissipation members may be added to enhance heat dissipation of the integrated circuit device. Additionally, different heat dissipation members such as a heat sink or a heat spreader may be integrated with the lid. Furthermore, although the invention has been described in particular orientations, words like "above," "below," "overlying," "up," "down," etc. should not be construed to require any absolute orientation.

As to a further discussion of the manner of usage and operation of the present invention, the same should be apparent from the above description. Accordingly, no further discussion relating to the manner of usage and operation will be provided.

With respect to the above description then, it is to be realized that the optimum dimensional relationships for the parts of the invention, to include variations in size, materials, shape, form, function and manner of operation, assembly and use, are deemed to be within the expertise of those skilled in the art, and all equivalent structural variations and relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

We claim:

1. An integrated circuit device, comprising:
    a substrate;
    a lid coupled to said substrate;
    a semiconductor chip attached to a first surface of said lid; and
    a cap attached to a second surface of said lid;
    wherein said cap is configured for spray cooling, at least one fence attached within the interior of said cap.

2. The integrated circuit device of claim 1, wherein said cap is attached to said lid through an adhesive around a perimeter of said cap.

3. The integrated circuit of claim 1, wherein said lid forms a cavity with respect to said substrate, wherein said semiconductor chip is positioned within said cavity.

4. The integrated circuit of claim 1, wherein a plurality of fins protrude from said second surface of said lid.

5. The integrated circuit of claim 1, wherein a plurality of grooves extend into said second surface of said lid.

6. The integrated circuit of claim 5, including openings within said plurality of grooves of said lid.

7. The integrated circuit of claim 1, wherein said semiconductor chip is attached to a surface of said substrate.

8. The integrated circuit of claim 1, wherein said lid is thermally conductive.

* * * * *